United States Patent
Cole et al.

(10) Patent No.: US 6,238,580 B1
(45) Date of Patent: May 29, 2001

(54) METHOD OF HF VAPOR RELEASE OF MICROSTRUCTURES

(75) Inventors: Robert C. Cole, Rancho Palos Verdes; Ruby E. Robertson, Los Angeles; Allyson D. Yarbrough, Hermosa Beach, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/460,738

(22) Filed: Dec. 14, 1999

Related U.S. Application Data

(63) Continuation-in-part of application No. 09/027,507, filed on Feb. 20, 1998, now abandoned.

(51) Int. Cl.⁷ .......................... H01L 21/02; H01L 21/302
(52) U.S. Cl. .............................. 216/2; 438/704; 438/735; 438/738; 438/742; 438/756
(58) Field of Search ................................. 216/2; 438/735, 438/742, 738, 704, 756

(56) References Cited

U.S. PATENT DOCUMENTS

| | | | |
|---|---|---|---|
| 5,645,684 | * 7/1997 | Keller | 156/643.1 |
| 5,683,591 | * 11/1997 | Offenberg | 216/2 |
| 5,994,696 | * 11/1999 | Tai et al. | 250/288 |
| 6,121,552 | * 9/2000 | Brosnihan et al. | 174/253 |

OTHER PUBLICATIONS

Williams, K.R. et al., "Etch Rates For Micromachining Processing," Journal of Microelectromechanical Systems, vol. 5, No. 4, Dec. 1996, pp. 256–269.*

* cited by examiner

Primary Examiner—Lorna M. Douyon
(74) Attorney, Agent, or Firm—Derrick Michael Reid

(57) ABSTRACT

A wet and vapor acid etching method releases a microelectromechanical systems (MEMS) structure from a substrate by dissolving a sacrificial layer disposed between the MEMS and the substrate. The sacrificial layer may be a silicon dioxide ($SiO_2$) layer having a field portion over which the MEMS does not extend and a support portion over which the MEMS does extend. The field portion of the $SiO_2$ layer is quickly removed using conventional wet hydrofluoric (HF) etching followed by rinsing and drying and then the support portion is removed using conventional vapor HF etching from a solution greater than 45% by weight percent. The wet HF chemical etch quickly removes the large field portion of the sacrificial layer. The HF vapor etch removes the small support portion of the sacrificial layer below the MEMS to release the MEMS from the substrate without stiction thereby preventing damage to the MEMS when released.

7 Claims, 2 Drawing Sheets

MEMS WET AND VAPOR ETCHING PROCESS

MEMS DEFINITION

MEMS POLYSILICON ETCH

FIELD WET ETCH

SUPPORT VAPOR ETCH

MEMS WET AND VAPOR ETCHING PROCESS

US 6,238,580 B1

METHOD OF HF VAPOR RELEASE OF MICROSTRUCTURES

This is a continuation-in-part of application Ser. No. 09/027,507, filed Feb. 20, 1998, now abandoned.

STATEMENT OF GOVERNMENT INTEREST

The invention was made with Government support under Contract No. FO4701-93-C-0094 by the Department of the Air Force. The Government has certain rights in the invention. The invention described herein may be manufactured and used by and for the government of the United States for governmental purpose without payment of royalty therefor.

FIELD OF THE INVENTION

The invention relates to the field of semiconductor processes. More specifically, the invention relates to hydrofluoric (HF) acid vapor etching release processes particularly suited for the reduction of stiction when releasing a microelectromechanical systems (MEMS) structure from a supporting substrate.

BACKGROUND OF THE INVENTION

Surface micromachining of a microelectromechanical systems (MEMS) structure fundamentally involves the deposition and patterning of at least two types of layers on top of a substrate. The first type of layer includes one or more structural layers in which the final MEMS structure is formed. The second type of layer includes sacrificial layers which support or encase the MEMS structure during formation of the MEMS and which is subsequently dissolved away resulting in a released MEMS structure.

The sacrificial layers are usually dissolved by immersing the devices in a wet chemical etchant for accomplishing the release of the MEMS structure. The sacrificial layers are typically disposed between the bottom substrate and the top MEMS structure layers. The wet chemical etching process etches the sacrificial layers between the MEMS structure layers and the substrate thereby releasing the MEMS structure from the substrate. Stiction occurs while the MEMS structure is immersed in a liquid etchant. Stiction also occurs while the MEMS structure is being slowly removed from the etchant or during rinsing with deionized water. Surface tension forces generated during the wet release process tend to cause stiction whereby a smooth underside surface of the released MEMS structure sticks to an even smoother substrate surface below the MEMS structure resulting in the MEMS structure being stuck to and in contact with the substrate. Such contact between the MEMS structure and substrate disadvantageously renders the MEMS structure immobile preventing proper actuation, desired flexure, or release of the MEMS structure from the substrate. The MEMS structure must then be mechanically pried up from the surface of the substrate substantially increasing the likelihood of damage to the MEMS structure and substrate.

The removal of the sacrificial layer with vapor phase etching is desirable in that it replaces the whole sequence of etching, rinsing steps, and elaborate drying procedure, not to mention the fact that no meniscus is formed during the releasing procedure. The removal of a sacrificial oxide with hydrofluoric acid (HF) vapor has been tested by researchers for years to release polysilicon structures. However, in reality, condensation of water on the etching surface renders the vapor process not so dry and the results have not been so satisfactory. The condensation cannot be easily avoided since water molecules are produced on the surface as a result of chemical reaction for oxide etching. The best result reported has been obtained by heating the wafer during vapor HF etching and preventing excessive water condensation.

The HF vapor etch of the silicon dioxide sacrificial layer is easy and convenient. However, the problem of removing water from the HF vapor has been solved by providing an anhydrous HF and $CH_3OH$ vapor mixture to release the MEMS structure in a completely dry fashion without stiction. This system disadvantageously requires the use of more complicated equipment such as an exhaust system. These and other disadvantages are solved or reduced using the invention.

SUMMARY OF THE INVENTION

An object of the invention is to provide a method for releasing a microelectromechanical systems (MEMS) structure.

Another object of the invention is to provide a method for quickly releasing a microelectromechanical systems (MEMS) structure using conventional wet and vapor hydrofluoric (HF) acid etching.

Yet another object of the invention is to provide a method for releasing a MEMS structure using a conventional wet HF etch to remove a field portion of a sacrificial layer and a vapor HF etch to remove a support portion of the sacrificial layer.

The invention is a method for releasing a MEMS structure. A sacrificial layer is disposed of between the MEMS and a substrate. The sacrificial layer may be, for example, a silicon dioxide ($SiO_2$) layer having a field portion into which the MEMS structure does not extend and a support portion over which the MEMS does extend. The field portion of the $SiO_2$ layer is removed using conventional wet hydrofluoric (HF) etching and the support portion is removed using conventional vapor hydrofluoric (HF) etching. The wet HF chemical etch quickly removes the large field portion of the sacrificial layer. The HF vapor etch removes the small support portion of the sacrificial layer below the MEMS structure to release the MEMS from the substrate. These and other advantages will become more apparent from the following detailed description of the preferred embodiment.

DETAILED DESCRIPTION OF THE PREFERRED EMBODIMENT

Figure 1A:
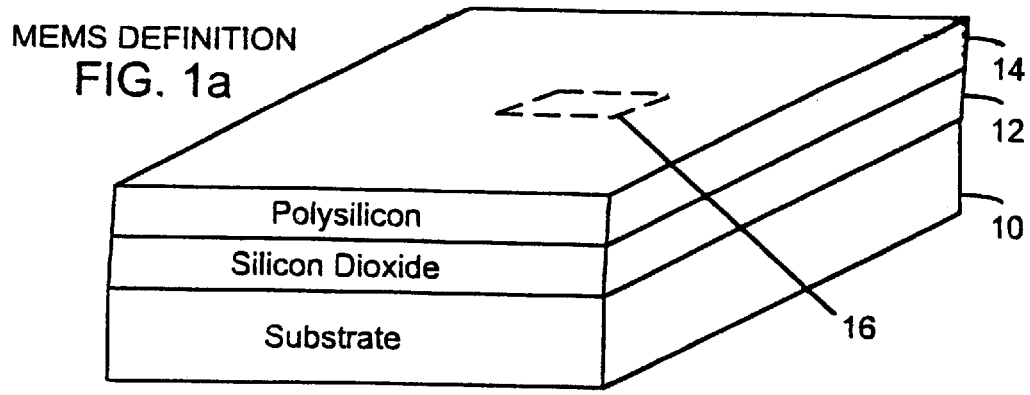
FIGS. 1a–d depict the formation of a released microelectromechanical systems (MEMS) structure.
Figure 1B:
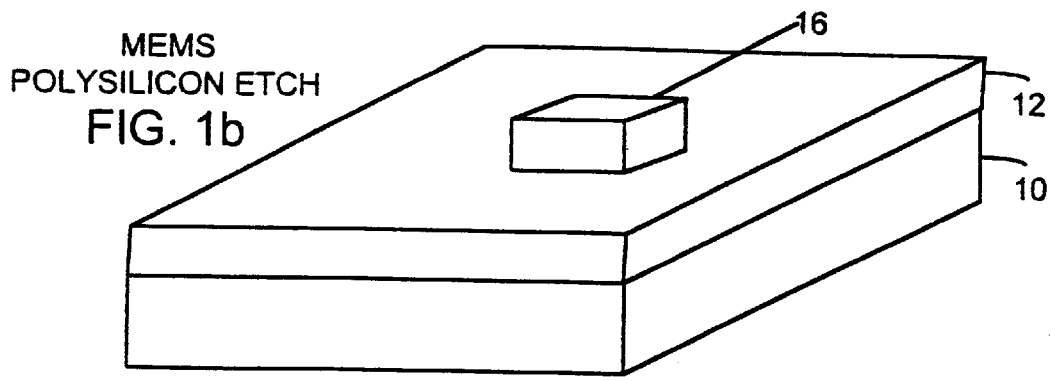
Figure 1C:
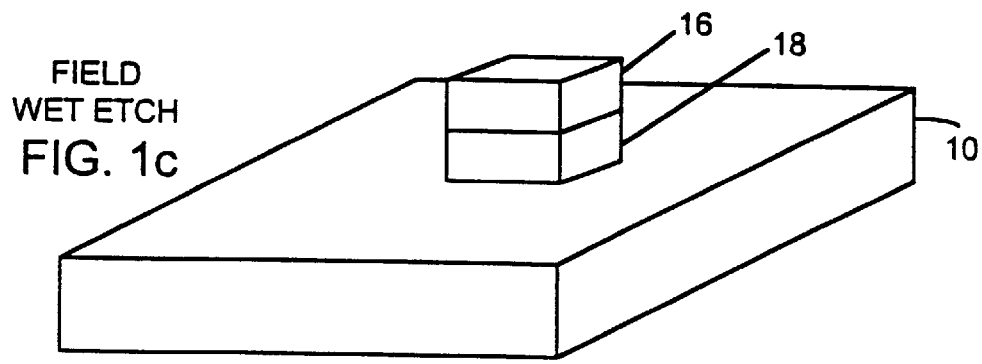
Figure 1D:
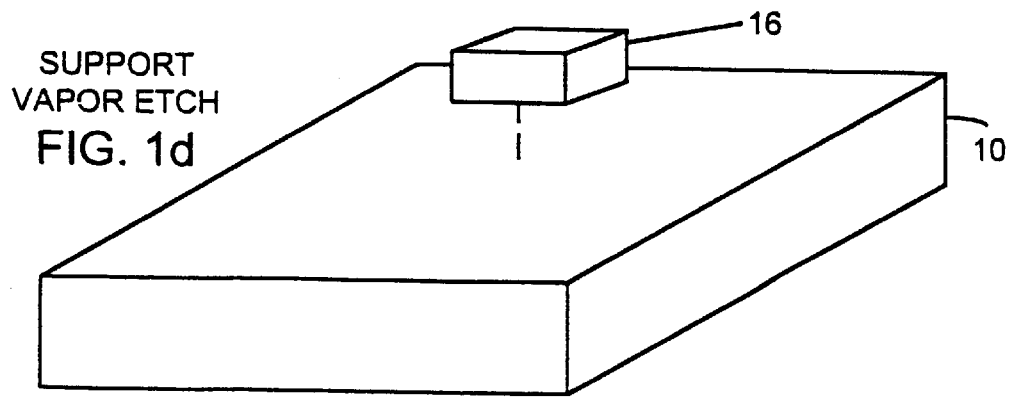

An embodiment of the invention is described with reference to the figures using reference designations as shown in the figures. Referring to the Figures 1a–d, a wafer is processed using conventional processes. The wafer including a substrate 10 supporting at least one sacrificial layer 12, which is preferably a silicon dioxide ($SiO_2$) layer, and a structure layer 14, which is preferably a polysilicon layer, is used to define a MEMS structure 16. The polysilicon layer 14 is etched using conventional polysilicon etching techniques to form the MEMS structure 16. A wet chemical hydrofluoric (HF) acid etch is used to etch a field portion of the $SiO_2$ layer 12 resulting in the remnant support portion 18 of the layer 12. An HF vapor etch is then used to etch the support portion 18 thereby releasing the MEMS structure 16 from the substrate 10. The MEMS structure 16 is shown for convenience as being completely released from the substrate 10, but the MEMS structure 16 may actually remain physically connected to the substrate 10 at another not shown portion of the MEMS structure 16.

Figure 2:
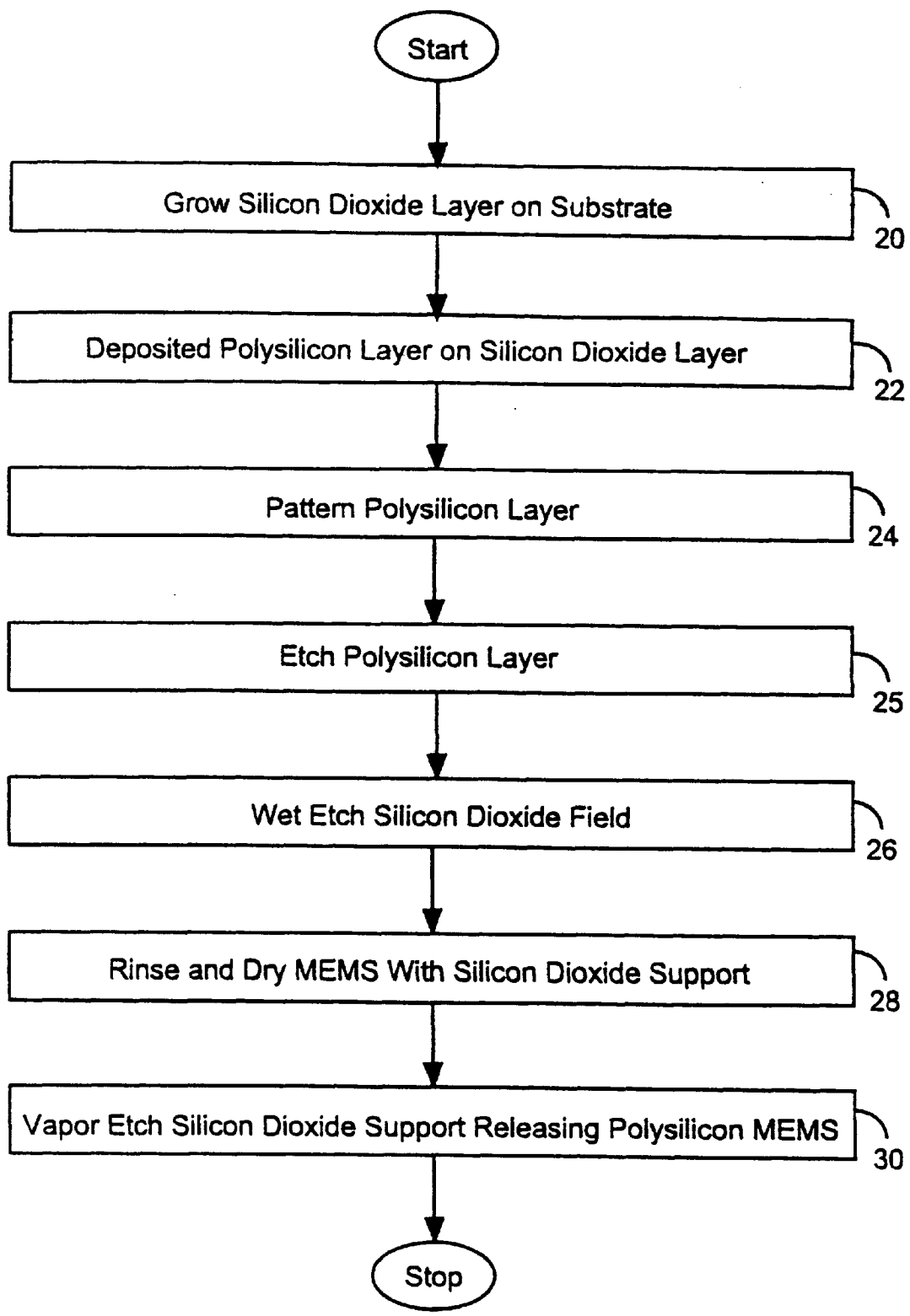
FIG. 2 is a flow diagram of a process for forming the released MEMS.

Referring to FIGS. 1a–d and FIG. 2, by way of example, the process starts with a substrate 10. The $SiO_2$ layer 12 is grown 20 on top of the substrate 10. The polysilicon layer 14 is then deposited 22 on top of the $SiO_2$ layer 12. The polysilicon layer 14 is then subjected to standard photolithography techniques using positive acting photo resist to define an image of the MEMS structure 16. The photo resist of the image of the MEMS structure 16 is protected from illumination by a photo mask. The photoresist over the field portion of the polysilicon layer 14 which was exposed to the illumination is removed in a developer solution leaving the unexposed patterned layer of photo resist 24. The field portion of polysilicon 14 is then reactive ion etched down to the silicon dioxide 12 and the photo resist patterned layer used as an etch mask is removed chemically leaving the structure defined in FIG. 1b. This is the preferred form of the invention but other conventional micromachining techniques may be used to define the MEMS 16 on top of a sacrificial oxide layer. The preferred form of the invention uses a $SiO_2$ layer, but any oxide layer that can be etched by an acid can be used. The wet HF chemical etch 26 is used to remove the field portion of the $SiO_2$ layer 12 resulting in the support portion 18 of the layer 12. The substrate 10, $SiO_2$ support portion 18 and MEMS 16 are then rinsed and dried 28 to remove excess water from the wafer 10, 18 and 16. Finally, the $SiO_2$ support portion 18 is etched 30 to release the MEMS 16 from the substrate 10. The preferred wet etching process 26 and vapor etching process 30 is HF to dissolve the $SiO_2$ layer 12, but any suitable acid may be used to dissolve a correspondingly suitable oxide layer 12. Those skilled in the art of MEMS and semiconductor processes are familiar with suitable acid etchants and dissolvable oxide layer combinations.

The wet HF chemical etch 26 preferably uses diluted HF or buffered oxide etch to remove the field portion of the sacrificial layer 12 surrounding the MEMS 16. The wet etch is an isotropic etch and will laterally undercut the MEMS to a depth equal to the thickness of the deposited sacrificial layer 12. To minimize undercutting, as soon as the field portion of the sacrificial layer 12 is etched from the surface of the substrate 10, the wafer 10, 18 and 16 is removed from the acid solution, rinsed in deionized water and thoroughly dried 28.

The final release 30 preferably uses concentrated HF acid vapors, of about 49%, to dissolve the remaining support portion 18 of the sacrificial layer 12. The vapor etch 30 is implemented in a conventional manner. A small amount of HF acid is dispensed in a Teflon container fitted with a pedestal, both not shown. The wafer 10, 18 and 16 is supported on the pedestal. Over this container, pedestal and wafer 10, 18 and 16, a Teflon beaker is placed upside down, creating a vapor etching chamber to capture the HF vapors in the vicinity of the wafer 10, 18 and 16. The HF vapors dissolve the support portion 18 of the sacrificial layer 12. The reaction products are completely volatile leaving the released MEMS 16 and the remainder of the structural layer 12 in tact. The requirements of the vapor etch are met by conventional well known HF vapor etching methods.

The combined wet etching process 26 and vapor etching process 30 offer advantages. The concentrated wet HF etch 26 quickly removes the relatively large field portion of the sacrificial layer 12. The rinsing and drying 28 removes most of the water that may cause stiction. The vapor HF etch 30 has reduced water content and quickly removes the relative small support portion 18 of the sacrificial layer 12 to remove the MEMS 16 without substantial stiction. The method reduces the amount of stiction and the attendant vulnerability to MEMS damage when being released 30.

The term azeotrope is defined as a solution that boils at a constant temperature, producing vapor of the same composition as the liquid. In some cases, the boiling point of the azeotrope is lower than that of either solution component at the minimum boiling point, and in other cases it is higher at the maximum boiling point. As to the use of the vapor, an azeotropic solution of HF at 38.26% to release surface-micromechanical structures suffers from residual stiction. A concentration of the vapor form at 49% HF solution is necessary to complete release micromechanical structures free of stiction. The MEMS structures released from undoped silicon dioxide films of thickness of $0.3\mu$ to $3.0\mu$ are stiction free only when the acid concentration of the solution from which the vapor is derived is greater than or equal 45%. Stiction free releases using a concentration greater than or equal to 45% by weight percent can be accomplished at normal laboratory operating room temperatures of 20° C. to 24° C.

Unlike the field silicon dioxide etch 26, the final vapor etching 30 does not require subsequent immersion, rinsing and nitrogen blow drying, and does provide a substantially stiction free release of the MEMS 16 from the substrate 10. The method can be applied to vast variety of oxide sacrificial layers that are etched by a wet or vapor acid solution. Those skilled in the art can make enhancements, improvements and modifications to the invention. However, those enhancements, improvements and modifications may nonetheless fall within the spirit and scope of the following claims.

What is claimed:

1. A method for stiction free release of a structure from a substrate, the method comprises the steps of, forming a sacrificial oxide layer on a substrate, forming a structural layer on the sacrificial oxide layer, defining a photolithographic image structure on the structural layer, structure etching the structural layer to remove a field portion of the structural layer resulting in the structure, wet acid etching a field portion of the sacrificial oxide layer resulting in a support portion of the sacrificial oxide layer between the substrate and the structure, rinsing and drying the structure and the support portion, generating a vapor from a solution of water and hydrofluoric acid having an acid concentration of greater than or equal to 45% by weight, and vapor acid etching the support portion with the vapor and releasing the structure from the substrate without stiction.

2. The method of claim 1 wherein the structure is a microelectromechanical systems structure.

3. The method of claim 1 wherein the sacrificial oxide layer is a silicon dioxide layer.

4. The method of claim 1 wherein, the sacrificial oxide layer is a silicon dioxide layer, and the wet acid etching step uses liquid hydrofluoric acid to etch the field portion of the silicon dioxide layer.

5. The method of claim 1 wherein, the structural layer is a polysilicon layer, the structure is defined by exposing through photoresist masking the polysilicon layer to selective optical illumination, and the structure is formed when the polysilicon layer is subjected to polysilicon etching.

6. The method of claim 1 wherein only a part of the support portion is vapor etched to release only a part of the structure from the substrate.

7. The method of claim 1 wherein the solution consists of 49% hydrofluoric acid by weight percent.

\* \* \* \* \*